United States Patent
Narita

[19]

[11] Patent Number: 6,144,107
[45] Date of Patent: Nov. 7, 2000

[54] SOLID STATE PICKUP DEVICE EXCELLENT IN HEAT-RESISTANCE AND METHOD OF MANUFACTURING THE DEVICE

[75] Inventor: Hirochika Narita, Tokyo, Japan

[73] Assignee: NEC Corporation, Tokyo, Japan

[21] Appl. No.: 09/275,822

[22] Filed: Mar. 25, 1999

[30] Foreign Application Priority Data

Mar. 26, 1998 [JP] Japan ................................. 10-079741

[51] Int. Cl.⁷ .......................... H01L 23/29; H01L 23/28; H01L 31/0203
[52] U.S. Cl. .......................... 257/789; 257/790; 257/791; 257/787; 257/783; 257/99; 257/100; 257/433
[58] Field of Search .................... 257/789–795, 257/787, 788, 783, 433, 99, 100

[56] References Cited

U.S. PATENT DOCUMENTS

| | | | |
|---|---|---|---|
| 4,710,797 | 12/1987 | Tanaka | 257/790 |
| 5,557,066 | 9/1996 | Rostoker et al. | 174/52.4 |
| 5,566,051 | 10/1996 | Burns | 361/704 |
| 5,644,169 | 7/1997 | Chun | 257/787 |

FOREIGN PATENT DOCUMENTS

| | | |
|---|---|---|
| 0 253 664 A2 | 1/1988 | European Pat. Off. . |
| 0 420 629 A1 | 4/1991 | European Pat. Off. . |
| 0 430 255 A2 | 6/1991 | European Pat. Off. . |
| 63-187652 | 8/1988 | Japan ................................. 257/787 |
| 63-269557 | 3/1989 | Japan . |
| 4-271153 | 9/1992 | Japan . |
| 8-335720 | 4/1997 | Japan . |

*Primary Examiner*—David Hardy
*Assistant Examiner*—Jhihan B Clark
*Attorney, Agent, or Firm*—Sughrue, Mion, Zinn, Macpeak & Seas, PLLC

[57] ABSTRACT

A solid state pickup device to which the present invention is applicable comprises a base member (1a) and a solid state pickup chip (3) having a bottom surface, a receiving surface for receiving light signal, and a side surface. The solid state pickup chip is glued on the base member by using a first adhesive (7). The solid state pickup device further comprises a solid package (6) formed around the base member and the solid state pickup chip having transparency. Herein, the first adhesive has flexibility. The solid state pickup device still further comprises a covering member (5) formed around the receiving and the side surfaces of the solid state pickup chip having transparency and flexibility.

9 Claims, 5 Drawing Sheets

SOLID STATE PICKUP DEVICE EXCELLENT IN HEAT-RESISTANCE AND METHOD OF MANUFACTURING THE DEVICE

BACKGROUND OF THE INVENTION

The present invention relates to a solid state pickup device and a method of manufacturing the device, and particularly relates to a solid state pickup device is of a solid-molded type in which the whole of the device is molded and a method of manufacturing the device of the type.

Although various kinds of the solid state pickup device is are well known, a charge coupled device (hereinafter, abbreviated as CCD) device is recently widely used. Therefore, the CCD device is hereinafter mentioned as the representative of the various solid state pickup devices. However, the present invention is applicable to all the solid state pickup devices.

As the representative of mold types of the CCD device, the following two examples are well known. One example is a hollow-molded CCD device such that the whole of the device is molded hollowly and that a space is left therein. The other example is a solid-molded CCD device such that the whole of the device is substantially molded solidly and that no space is left therein. A method of manufacturing the solid-molded CCD device is, for example, disclosed in Japanese Unexamined Patent Publication (JP-A) No. 271153/1992.

The above-mentioned conventional CCD devices have the following problems.

Firstly, a reflow-soldering process, that is generally used for automatic mounting used to mount electrical devices or devices on a printed circuit board, cannot be applied to the hollow-molded or the solid-molded CCD device when mounted on the printed circuit board. Therefore, the hollow-molded or the solid-molded CCD device must be mounted on the printed circuit board by handwork using a soldering iron or a spouting-solder.

The reason is as follows. The hollow-molded CCD device comprises a top plate glued on an upper end thereof by using adhesive. The adhesive is set or cured by photosetting (photocuring) by ultraviolet rays. The top plate is deformed between approximate 80 and 160° C. The adhesive is spoiled approximately between approximate 100 and 120° C. On the other hand, the CCD device must be heated between approximately 260 and 300° C. at lowest when applied into the reflow-soldering process. Namely, the top plate and the adhesive are deformed and spoiled when the reflow-soldering process is applied to the hollow-molded CCD device. On the other hand, the solid-molded CCD device comprises a solid package and a CCD chip packaged in the solid package. The solid package is comparatively better in heat-resistance. Therefore, the solid-molded CCD device can resist or withstand the reflow-soldering process if the process is short in time. However, the solid package and the CCD chip are greatly different from each other in heat-expansion coefficient. This means that the solid package and a CCD chip are stressed on each other when the reflow-soldering process is applied to the solid-molded CCD device. Therefore, the solid package or the CCD chip is cracked and the CCD chip is deformed. In addition, a surface of the solid package is deteriorated in flatness. Consequently, the solid-molded CCD device is deteriorated in optical and electrical performances.

Secondary, it is difficult to reduce the hollow-molded CCD device in size. The reason is that the hollow-molded CCD device needs enough space around the CCD chip in the hollow package so that bonding-wires are arranged without contacting each other.

SUMMARY OF THE INVENTION

It is therefore an object of the present invention to provide a solid state pickup device excellent in heat-resistance so particularly as to resist or to withstand the reflow-soldering process.

It is another object of the present invention to provide a solid state pickup device excellent in optical and electrical performances.

It is still another object of the present invention to provide a solid state pickup device small in size.

It is another object of the present invention to provide a method for manufacturing the solid state pickup devices as mentioned above.

The other objects, features, and advantages of the present invention will become clear as the description proceeds.

The present invention is directed to a solid state pickup device for receiving light signal and converting the received light signal into electrical signal. The solid state pickup device comprises a base member (1a) having a main surface and a solid state pickup chip (3) having a bottom surface, a receiving surface opposite to the bottom surface for receiving the light signal, and a side surface extending between the bottom and the receiving surfaces. The solid state pickup chip (3) is glued on the main surface of the base member (1a) by using a first adhesive (7) with the bottom surface faced to the main surface. The solid state pickup device further comprises a solid package (6) formed around the base member (1a) and the solid state pickup chip (3) and having transparency. Herein, the first adhesive (7) has flexibility. The solid state pickup device still further comprises a covering member (5) formed around the receiving and the side surfaces of the solid state pickup chip (3) having transparency and flexibility. The solid state pickup chip (3) is isolated from the base member (1a) and the solid package (6) through the first adhesive (7) and the covering member (5) with the bottom, the side, and the receiving surfaces not exposed to the base member (1a) and the solid package (6).

The present invention is also directed to a method of manufacturing a solid state pickup device for receiving light signal and converting received light signal into electrical signal. The solid state pickup device comprises a base member (1a) having a main surface and a solid state pickup chip (3) having a bottom surface, a receiving surface opposite to the bottom surface for receiving the light signal, and a side surface extending between the bottom and the receiving surfaces. The method comprises the steps of: gluing the solid state pickup chip (3) on the main surface of the base member (1a) by using a first adhesive (7) with the bottom surface faced to the main surface, and forming a solid package (6) around the base member (1a) and the solid state pickup chip (3), the solid package (6) having transparency, wherein the first adhesive (7) has flexibility. The method further comprises a step of forming a covering member (5) around the receiving and the side surfaces of the solid state pickup chip (3). The covering member (5) has transparency and flexibility. The solid state pickup chip (3) is isolated from the base member (1a) and the solid package (6) through the first adhesive (7) and the covering member (5) with the bottom, the side, and the receiving surfaces not exposed to the base member (1a) and the solid package (6).

DESCRIPTION OF THE PREFERRED EMBODIMENTS

In order to facilitate an understanding of the present invention, description will at first be made with reference to the drawings about conventional solid state pickup devices of types described in the preamble of this specification.

Figure 1:
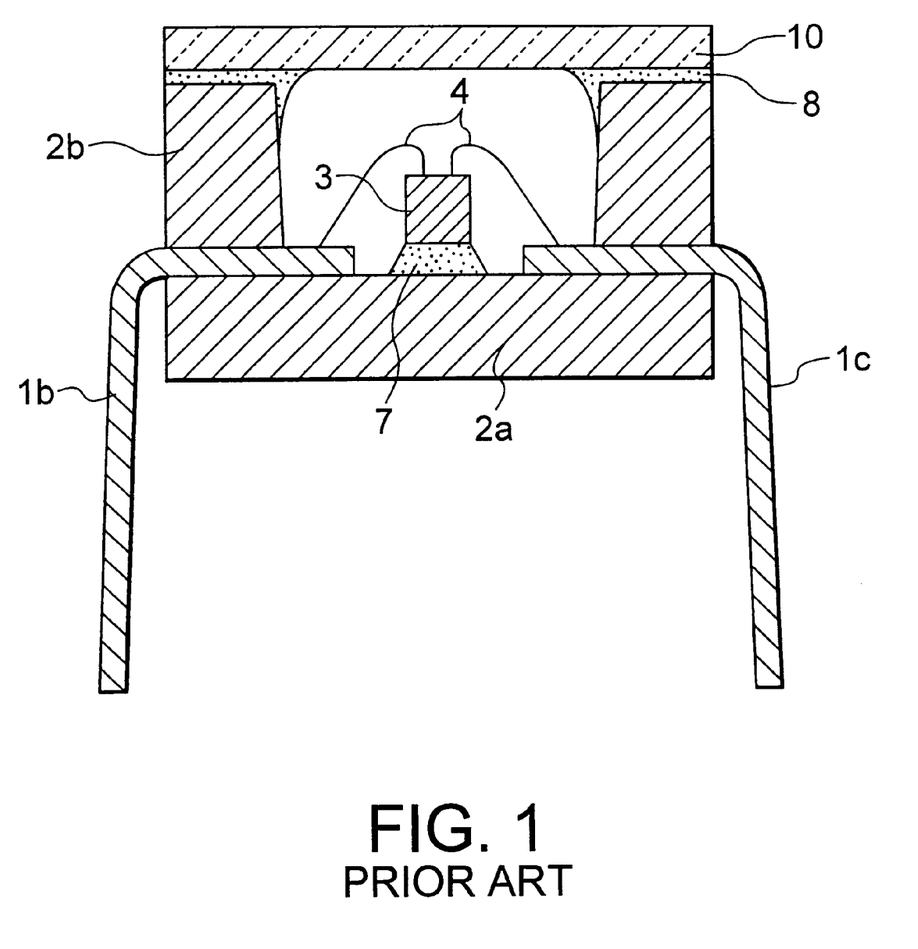
FIG. 1 is a cross sectional view showing a hollow-molded CCD device as a conventional solid state pickup device.

Referring to FIG. 1, a conventional solid state pickup device is a CCD device and comprises a pair of lead terminal-lines or terminal-groups 1b and 1c provided with a plurality of lead terminals arranged in parallel to one another in a direction perpendicular to the sheet surface of FIG. 1, respectively, a base portion 2a made of opaque epoxies-resin, a CCD chip 3 glued (die-bonded) on the base portion 2a by adhesive 7 made of silicone-compound, a plurality of bonding-wires 4 bonded between the terminal-lines 1b and 1c and the CCD chip 3, respectively, a cylindrical wall portion 2b made of opacity epoxies-resin and integrally formed on the base portion 2a through the terminal-lines 1b and 1c, and a top plate 10 made of transparent resin and glued on an upper end of the cylindrical wall portion 2b by transparent adhesive 8 can be set or cured by ultraviolet-curing. In addition, the base portion 2a and the cylindrical wall portion 2b may be molded individually. The base portion 2a, the cylindrical wall portion 2b, and the top plate 10 cooperate to serve as a package of the CCD device. The CCD device of the package type mentioned above is called a hollow-molded CCD device because a space is left in the package.

Figure 2:
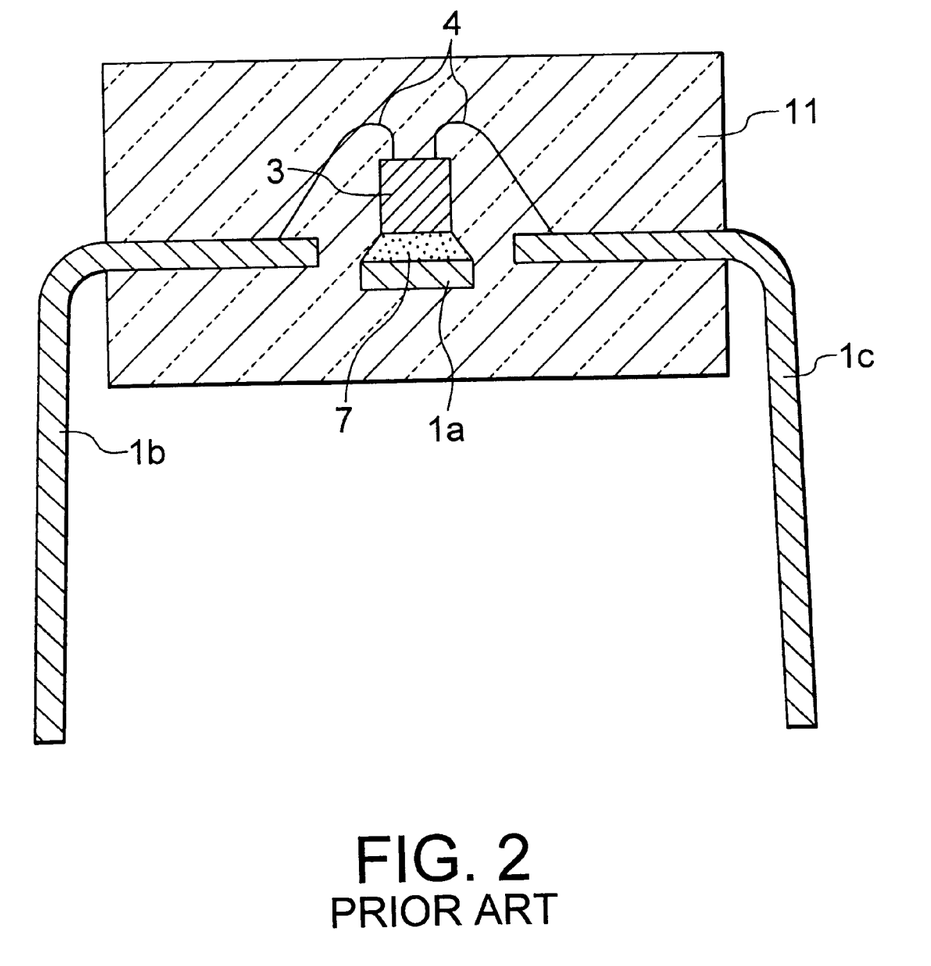
FIG. 2 is a cross sectional view showing a conventional solid-molded CCD device as the other conventional solid state pickup device.

Referring to FIG. 2, the other conventional solid state pickup device is also a CCD device. The CCD device comprises a pair of lead terminal-lines or terminal-groups 1b and 1c provided with a plurality of lead terminals arranged in parallel to one another in a direction perpendicular to the sheet surface of FIG. 2, respectively, an island member 1a connected to the terminal-lines 1b and 1c by an extra member not shown before the device is completed, a CCD chip 3 glued (die-bonded) on the island member 1a by adhesive 7 made of silicone-compound, a plurality of bonding-wires 4 bonded between the terminal-lines 1b and 1c and the CCD chip 3, respectively, a solid package 11 made of transparent resin can be set or cured by thermosetting or photosetting and formed (molded) so as to cover the terminal-lines 1b and 1c, the island member 1a, the CCD chip 3, and the bonding-wires 4 therein. The CCD device of the package type mentioned above is called a solid-molded CCD device because it is fully molded by the solid package so that all the members are molded.

The CCD device is manufactured as follows. A lead frame (not shown), which comprises the terminal-lines 1b and 1c and the island member 1a connected to one another by a peripheral frame as the extra member, is prepared. The CCD chip 3 is die-bonded on the island 1a by the adhesive 7. The bonding-wires 4 are bonded between the terminal-lines 1b and 1c and the CCD chip 3, respectively. The lead frame is set in a casting mold not shown. Molten transparent resin can be set or cured by thermosetting or photosetting is poured into the casting mold. The melted resin is set or cured by heating and therefore is formed as the solid package 11. The solid package 11 is taken out from the casting mold. The peripheral frame is removed from the lead frame. Thus, the solid-molded CCD device is completed.

The conventional CCD devices have problems described in the preamble.

Now, preferred embodiments of the present invention will be described with reference to FIGS. 3 to 5.

First Embodiment

Figure 3:
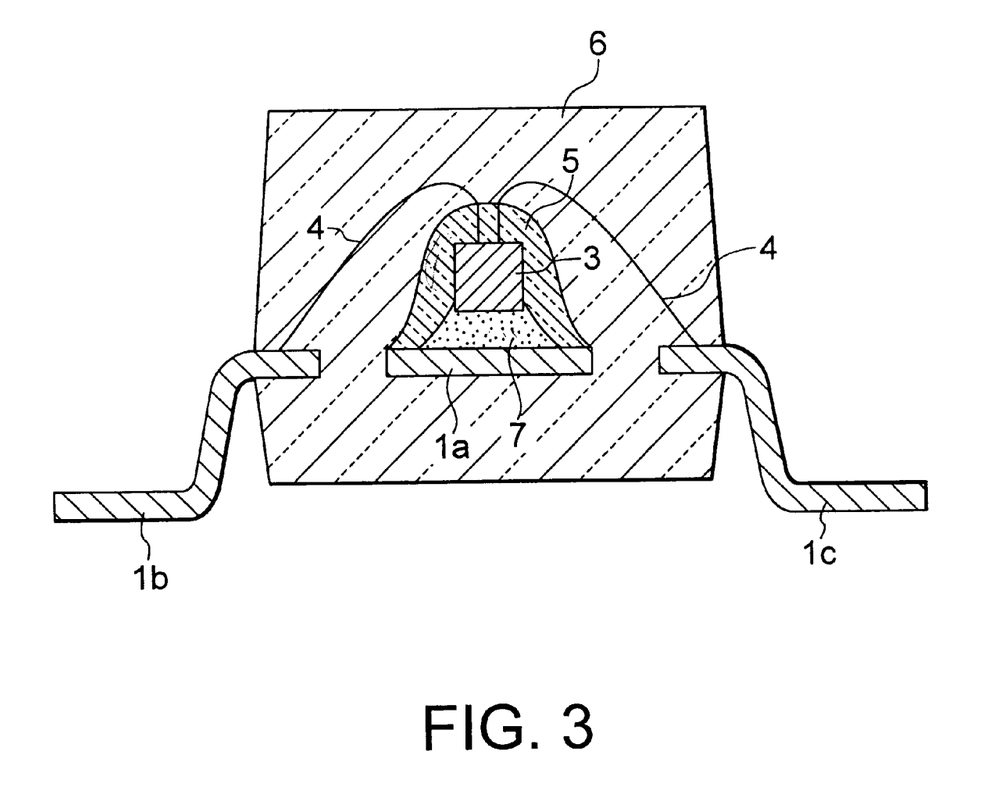
FIG. 3 is a cross sectional view showing a solid-molded CCD device as a solid state pickup device according to a first embodiment of the present invention.

Referring to FIG. 3, a solid state pickup device according to a first embodiment of the present invention is also a solid-molded CCD device. The solid-molded CCD device of this embodiment has similar parts designated by the same reference numerals that are illustrated in FIG. 2.

The solid-molded CCD device comprises a pair of lead terminal-lines or terminal-groups 1b and 1c provided with a plurality of lead terminals arranged in parallel to one another in a direction perpendicular to the sheet surface of FIG. 3, respectively, an island member 1a connected to the terminal-lines 1b and 1c by an extra member (not shown) before the device is completed, a CCD chip 3 glued (die-bonded) on the island member 1a by adhesive 7 made of silicone-compound having flexibility, a plurality of bonding-wires 4 bonded between the terminal-lines 1b and 1c and connection pattern (not shown) formed on a top surface as a receiving surface of the CCD chip 3, respectively, a covering member 5 made of transparent resin having flexibility formed around the top surface and the side surfaces of the CCD chip 3, and a solid package 6 made of transparent resin can be set or cured by thermosetting or photosetting and formed (molded) so as to cover the terminal-lines 1b and 1c, the island member 1a, the CCD chip 3 covered with the covering member 5, and the bonding-wires 4 therein. In place of the transparent resin of the thermosetting type, the photosetting type may be used. The solid package 6 is rigid to serve as a shell of the CCD device.

The CCD chip 3 is isolated from the island member 1a and the solid package 6 through the adhesive 7 and the covering member 5 with a bottom surface, the side surfaces, and the top surface thereof not exposed to the island member 1a and the solid package 6.

Figure 4:
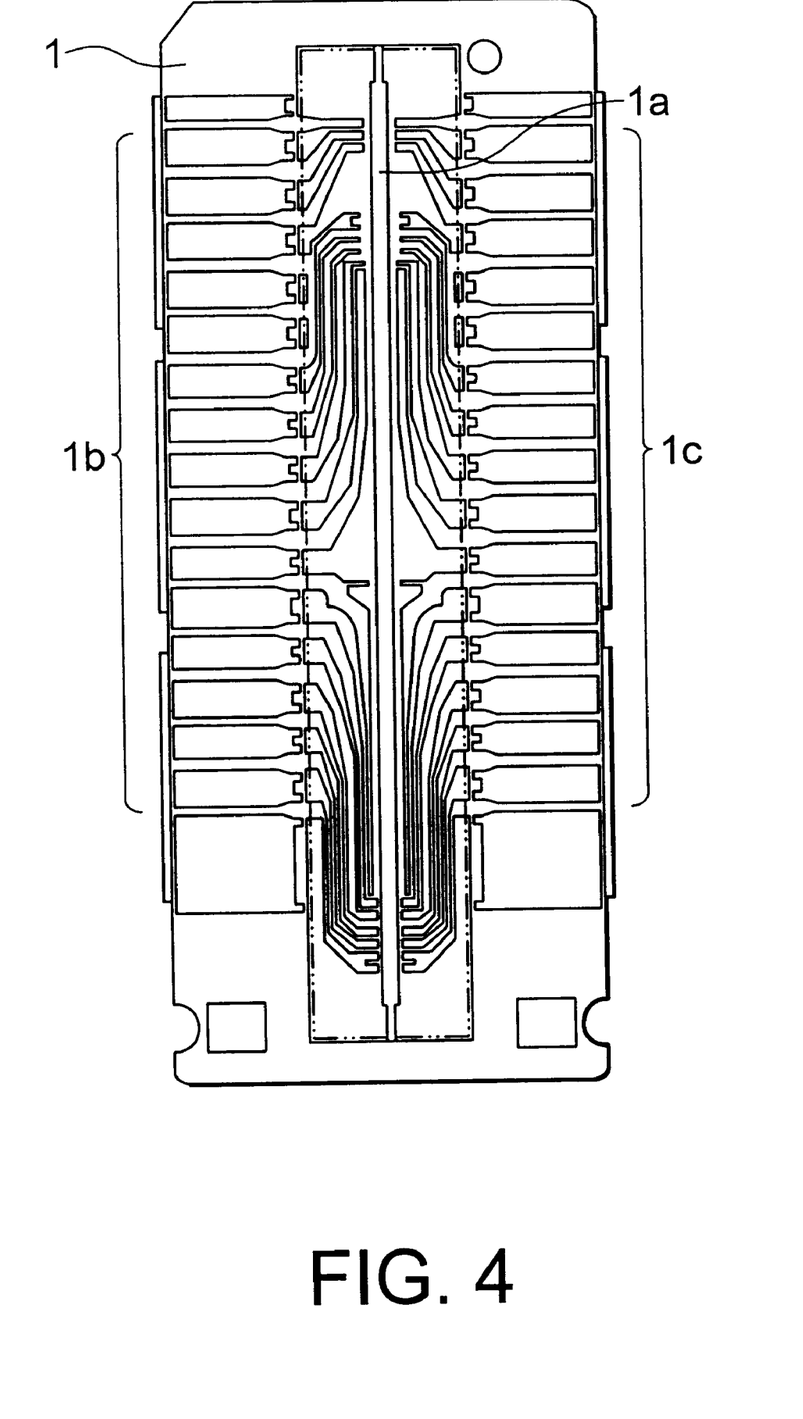
FIG. 4 is a plan view showing a lead frame used for manufacturing the solid-molded CCD device shown in FIG. 3.

FIG. 4 shows a lead frame 1 used for manufacturing the solid-molded CCD device. The frame 1 also serves as the island member 1a and the terminal-lines 1b and 1c when the device is completed. The lead frame 1 is made by punching out a metal plate made of ferroalloy or copper alloy and plating the punched plate with metal. In the lead frame 1, the island member 1a serves to mount the CCD chip 3 thereon.

Now, a method of manufacturing the above-mentioned solid-molded CCD device will be described with reference to FIGS. 3 and 4.

The adhesive 7 is dispensed from a dispenser of the adhesive and which is spread on the island member 1a. It is preferred that the adhesive 7 is elastic, flexible, or sticky material like gum or jelly and which is not lower than 300° C. in temporary heat-resistance. For example, the adhesive 7 is made of silicone resin, polyurethane resin, rubber, and so on.

The CCD chip 3 is mounted on the island member 1a through the adhesive 7. The lead frame 1 with the CCD chip 3 mounted thereon is put into a homoiothermic tank. The homoiothermic tank is controlled so that an inner temperature therein is maintained between 80 and 180° C. Thus, the adhesive 7 is set or cured but still has flexibility.

The bonding-wires 4 are bonded between the terminal-lines 1b and 1c and the connection patterns formed on the receiving (top) surface of the CCD chip 3, respectively.

The transparent resin is dispensed from a dispenser of the resin onto the top and the side surfaces of the CCD chip 3 and a top surface of the island 1a except an area for mounting the CCD chip 3 thereon. Thus, the covering member 5 made of the transparent resin is formed around the top and the side surfaces of the CCD chip 3 and the area of the island 1a. The covering member 5 has flexibility.

As the transparent resin, resin of thermosetting or photosetting type is prepared and used. The resin has liquid form before being set or cured which is slight in reaction when set or cured. Namely, the resin is spread flatly with spreading thickness constant being before set or cured, and is not less than 20 μm in set thickness thereof after being set or cured. Furthermore, it is preferred that the resin is elastic, flexible, or sticky like gum or jelly and which is not lower than 300° C. in temporary heat-resistance after being set or cured. For example, silicone resin or polyurethane resin added a little drizzly-silica and provided with reaction property little is preferred as the thermosetting or the photosetting resin. In order to set or cure the transparent resin, the lead frame 1 is put into the homoiothermic tank controlled so that the inner temperature therein is maintained between 80 and 180° C. or an ultraviolet-curing furnace for applying ultraviolet rays to the resin.

Thereafter, the solid package 6 is formed (molded) so as to cover the island member 1a, the CCD chip 3 covered with the covering member 5, and the bonding-wires 4 therein by a transfer-molding. The solid package 6 is transparent and is formed by the transfer-molding. The transparent resin becomes the solid package 6 which is rigid with Shore-D hardness not less than 80 after being set or cured by the transfer-molding. As the transparent resin, a resin capable of being set or cured by thermosetting or photosetting may be used.

Portions sticking out from the solid package 6 of the terminal-lines 1b and 1c are bent into prescribed forms, respectively. Furthermore, the peripheral frame of the lead frame 1 is cut away. Thus, the solid-molded CCD device is completed.

All component members or pieces of the solid-molded CCD device are not lower than 300° C. in at least temporary heat-resistance.

The covering member covering the CCD chip without space or aperture left therebetween is transparent and which is between 0 and 30 in hardness (a rubber hardness standardized in JIS-A).

When the solid-molded CCD device completed as mentioned above is applied to the reflow-soldering process, the solid-molded CCD device is cooled after being heated between 260 and 300° C. When the solid-molded CCD device is cooled after being heated, the component members of the device such as the island member 1a, the terminal-lines 1b and 1c, the CCD chip 3, and the solid package 6 shown in FIG. 2 are inconsistently expanded and shrunk according to inconsistent heat-expansion coefficients, respectively. Therefore, the component members are stressed to one another. Particularly, the solid package 6 is shrunk remarkably and irreversibly after cooled and therefore stresses itself and other component members remarkably and irreversibly. The solid package 6 may be deformed and cracked. The solid package 6 may be also deteriorated in flatness and therefore may interfere with the optical signal traveled to the CCD chip 3.

However, the covering member 5 and the adhesive 7 are shrunk by stresses of the component members and therefore absorb the stresses and prevent the stresses from traveling to the CCD chip 3 because they are flexible. Thus, the CCD chip 3 is not stressed, deformed, and cracked. Furthermore, the solid package 6 is not stressed, deformed, cracked, and deteriorated in flatness although shrunk remarkably and irreversibly. Therefore, the solid package 6 does not interfere with the optical signal traveled to the CCD chip 3.

Next, the method of manufacturing the solid-molded CCD device will be more concretely described with reference to FIGS. 3 and 4.

The lead frame 1 shown in FIG. 4 is prepared. Namely, A sheet made of copper alloy between 0.15 and 0.25 mm in thickness is prepared. The sheet metal is pressed into a form shown in FIG. 4. The pressed metal is plated with a noble metal such as gold, silver, palladium, or rhodium between 0.004 and 0.500 μm in thickness. Thus, the lead frame 1 is completed.

Silicone compound serving as the adhesive 7 is prepared. The silicone compound is approximately 100 p (where the device is Poise) in viscosity before set or cured while between 0 and 30 in hardness (the rubber hardness standardized in JIS-A) after set or cured by heating between 150 and 200° C.

The silicone compound is dispensed from the dispenser and which is spread on the island member 1a. The CCD chip 3 is mounted on the island member 1a through the silicone compound. The lead frame 1 with the CCD chip 3 mounted thereon is put into a homoiothermic tank. The homoiothermic tank is controlled so that an inner temperature therein is maintained between 80 and 180° C. Thus, the adhesive 7 is set or cured but which has flexibility with Shore-D hardness between 20 and 30.

The bonding-wires 4 are bonded between the terminal-lines 1b and 1c and the connection patterns formed on the receiving (top) surface of the CCD chip 3, respectively.

Silicone compound of thermosetting-type for making the covering member 5 is prepared. The silicone compound is between 20 and 40 p in viscosity and which is between 1.0 and 1.2 in thixotropic factor before set or cured while 0 in Shore-A hardness and not less than 90% in transparency after set or cured by heating between 150 and 200° C.

The silicone compound is dispensed from the dispenser over the CCD chip 3 so that the top and the side surfaces thereof and a top surface of the island 1a except an area mounting the CCD chip 3 thereof are covered with the compound.

The lead frame 1 with the CCD chip 3 mounted thereon and covered with the compound is put into a homoiothermic tank. The homoiothermic tank is controlled so that an inner temperature therein is maintained between 150 and 200° C. After the lead frame 1 has been put in the tank for 1 or 2 hour, the covering member 5 with the transparency 90% is thus set or cured but which has flexibility with Shore-A hardness 0. The covering member 5 is formed around the top and the side surfaces of the CCD chip 3 and the area of the island 1a.

Resin of thermosetting-type for making the solid package 6 is prepared. The resin consists essentially of epoxy resin of epi-bis- or bis-epi-type such as bisphenol-epichlorohydrin epoxy resin as main agent, hexahydrophthalic anhydride serving as the hardening agent and sub agent, and traces of curing acceleration agent, mold release agent, surface treatment agent, and other agents as the balances. After the resin is set or cured by heating between 80 and 180° C., the resin is approximately 85 in Shore-D hardness and approximately 92% in transparency.

By the transfer-molding, the resin is formed or molded so as to cover the island member 1a, the CCD chip 3 covered with the covering member 5, and the bonding-wires 4 therein. The molded resin serves as the solid package 6. The solid package 6 is 92% in transparency and which is rigid.

Portions of the terminal-lines 1b and 1c sticking out from the solid package 6 are bent into prescribed forms, respectively. Furthermore, the peripheral frame of the lead frame 1 is cut away. Thus, the solid-molded CCD device is completed.

Second Embodiment

In the solid-molded CCD device according to the first embodiment mentioned above, a top surface of the resin for forming the solid package 6 is often uneven after the transfer-molding. The reason is that the lead frame 1 is uneven and has slits or holes in many portions thereof. Another reason is that the resin is shrunk and cured in inconsistent rates at many areas thereof.

A second embodiment of the present invention serves to improve the above-mentioned problem.

Figure 5:
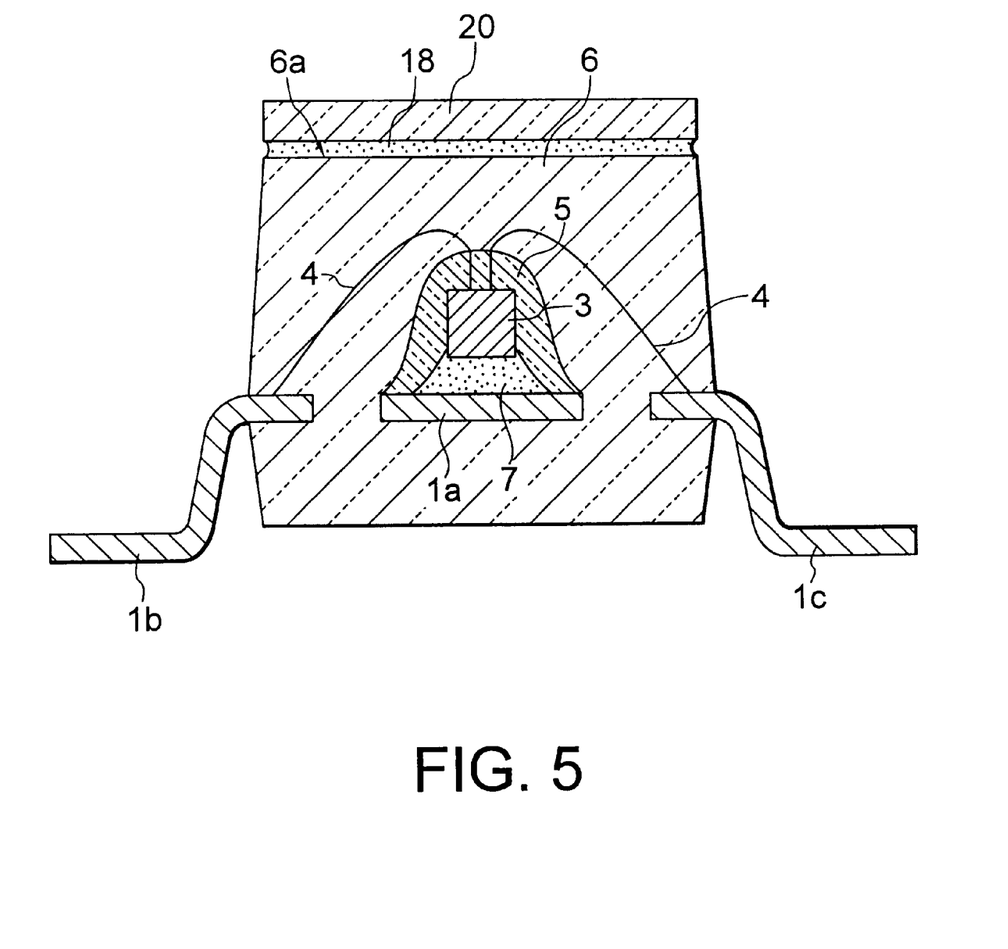
FIG. 5 is a cross sectional view showing another solid-molded CCD device as a solid state pickup device according to a second embodiment of the present invention.

Referring to FIG. 5, a solid state pickup device according to the second embodiment of the present invention is also a solid-molded CCD device. The solid-molded CCD device of this embodiment has similar parts designated by the same reference numerals that are illustrated in FIG. 3 about the first embodiment.

Namely, the solid-molded CCD device further comprises a top plate 20 formed or attached on a top surface 6a of the solid package 6 through an adhesive 18. The top plate 20 is transparent, rigid, and tensional like glass. The adhesive 18 can be set or cured by ultraviolet-curing and is transparent and flexible.

Concretely, the top plate 20 is attached to the top surface 6a of the solid package 6 by the following manner.

As the adhesive 18, a transparent adhesive of urethane acrylate-series is prepared. The adhesive 18 will be between 40 and 50 in Shore-D hardness after cured or set.

On the other hand, the top plate 20 is prepared. The top plate is made of plastic selected from acrylic acid resin, polycarbonate, and polyether sulfonic acid of norbornane-series while made of borosilicate glass and so on.

Furthermore, the solid-molded CCD device completed by the method according to the first embodiment is prepared.

Now, the adhesive 18 is spread over the top surface 6a of the solid package 6.

The top plate 20 is mounted on the top surface 6a through the adhesive 18.

The adhesive 18 is irradiated through the top plate 20 by ultraviolet rays not less than 3000 mJ/cm$^2$ output from a high pressure mercury vapour lamp or a metal halide lamp and which is thus cured but flexible such that Shore-D hardness between 40 and 50. Thus, the solid-molded CCD device with the top plate 20 attached thereon is completed.

In the solid-molded CCD device with the above-mentioned structure, a top surface of the top plate 20 serving as a top surface of the device is flat if the top surface 6a of the solid package 6 is uneven after the transfer-molding. Therefore, the solid-molded CCD device is excellent in optical and electrical performances because the device can receive the light signal without refracting and diffused-reflecting the light signal. Furthermore, if the top plate 20 and the solid package 6 are different in the expansion or a shrinkage coefficient to each other, these members are not stressed to each other because the stresses are absorbed by the adhesive 18.

While the present invention has thus far been described in conjunction with a few embodiments thereof, it will readily be possible for those skilled in the art to put the present invention into practice in various other manners. For example, the present invention is capable of applying to another solid state pickup device such as a device using a CMOS (a Complementary Metal-Oxide Semiconductor) chip instead of the CCD chip. Furthermore, the present invention is capable of adopting flexible members made of various materials instead of gum-like and jelly-like resins as the covering member.

What is claimed is:

1. A solid state pickup device for receiving light as a light signal and converting the received light signal into an electrical signal, which comprises a base member (1a) having a main surface and a solid state pickup chip (3) having a bottom surface, a receiving surface opposite to said bottom surface for receiving the light signal, and a side surface extending between said bottom and said receiving surfaces, said solid state pickup chip (3) being glued on said main surface of said base member (1a) by using a first adhesive (7) with said bottom surface faced to said main surface, said solid state pickup device further comprising a transparent solid package (6) formed around said base member (1a) and said solid state pickup chip (3), wherein said first adhesive (7) is flexible;

said solid state pickup device still further comprising preventing means operative to prevent stresses applied to said solid state pickup device during a reflow-soldering process from deforming said solid package or from harming said solid state pickup chip (3), wherein said preventing means comprises a transparent and flexible covering member (5) formed around said receiving and said side surfaces of said solid state pickup chip (3), and said first adhesive;

said solid state pickup chip (3) being isolated from said base member (1a) and said solid package (6) through said first adhesive (7) and said covering member (5) with said bottom, said side, and said receiving surfaces not exposed to said base member (1a) and said solid package (6).

2. A solid state pickup device as claimed in claim 1, wherein said solid state pickup device is a solid-molded charge coupled device (hereinafter, abbreviated as CCD) device which comprises a CCD chip serving as said solid state pickup chip (3).

3. A solid state pickup device as claimed in claim 1, wherein said first adhesive (7) is made essentially of rubber.

4. A solid state pickup device as claimed in claim 1, wherein said covering member (5) is made essentially of transparent rubber.

5. A solid state pickup device as claimed in claim 1, wherein said first adhesive (7) is made essentially of gel resin.

6. A solid state pickup device as claimed in claim 1, wherein said covering member (5) is made essentially of transparent gel resin.

7. A solid state pickup device as claimed in claim 1, wherein said covering member (5) is made essentially of transparent gelled silicone-compound;

said solid package (6) is made essentially of transparent epoxies-compound.

8. A solid state pickup device as claimed in claim 1, wherein said covering member (5) is greater than 20 microns in thickness.

9. A solid state pickup device for receiving light as a light signal and converting the received light signal into an electrical signal, which comprises a base member (1a) having a main surface and a solid state pickup chip (3) having a bottom surface, a receiving surface opposite to said bottom surface for receiving the light signal, and a side surface extending between said bottom and said receiving surfaces, said solid state pickup chip (3) being glued on said main surface of said base member (1a) by using a first adhesive (7) with said bottom surface faced to said main surface, said solid state pickup device further comprising a transparent solid package (6) formed around said base member (1a) and said solid state pickup chip (3), wherein said first adhesive (7) is flexible;

said solid state pickup device still further comprising a transparent and flexible covering member (5) formed around said receiving and said side surfaces of said solid state pickup chip (3);

said solid state pickup chip (3) being isolated from said base member (1a) and said solid package (6) through said first adhesive (7) and said covering member (5) with said bottom, said side, and said receiving surfaces not exposed to said base member (1a) and said solid package (6), wherein said solid state pickup device further comprises a top plate (20) made essentially of transparent plastic or of glass, said top plate (20) being glued on said solid package (6) by using a second adhesive (18), and further wherein said second adhesive (18) is transparent and flexible.

* * * * *